US012774519B2

(12) United States Patent
Yamazaki et al.

(10) Patent No.: US 12,774,519 B2
(45) Date of Patent: Oct. 27, 2026

(54) DIELECTRIC COMPOSITION, CAPACITIVE ELEMENT, VISIBLE-LIGHT PHOTOCATALYTIC MATERIAL, AND VISIBLE-LIGHT PHOTOELECTRIC CONVERSION ELEMENT

(71) Applicants: TDK CORPORATION, Tokyo (JP); NATIONAL UNIVERSITY CORPORATION HOKKAIDO UNIVERSITY, Sapporo (JP)

(72) Inventors: Kumiko Yamazaki, Tokyo (JP); Shuto Kano, Tokyo (JP); Yuji Masubuchi, Sapporo (JP); Shinichi Kikkawa, Suita (JP)

(73) Assignees: TDK CORPORATION, Tokyo (JP); NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 569 days.

(21) Appl. No.: 18/348,417

(22) Filed: Jul. 7, 2023

(65) Prior Publication Data

US 2024/0011152 A1 Jan. 11, 2024

(30) Foreign Application Priority Data

Jul. 11, 2022 (JP) ................................ 2022-111286
May 17, 2023 (JP) ................................ 2023-081744

(51) Int. Cl.

| | |
|---|---|
| *C23C 16/30* | (2006.01) |
| *B01J 35/00* | (2024.01) |
| *B01J 35/39* | (2024.01) |
| *C23C 16/515* | (2006.01) |

(52) U.S. Cl.
CPC ............ *C23C 16/308* (2013.01); *B01J 35/39* (2024.01); *C23C 16/515* (2013.01)

(58) Field of Classification Search
CPC .... C23C 16/308; C23C 14/0676; B01J 27/24; B01J 35/733; C01B 21/0821
See application file for complete search history.

(56) References Cited

PUBLICATIONS

Hosono et al.; "Ferroelectric BaTaO2N Crystals Grown in a BaCN2 Flux;" Inorg. Chem .; 2019; pp. 16752?16760; vol. 58.

*Primary Examiner* — Cameron K Miller
(74) *Attorney, Agent, or Firm* — Oliff PLC

(57) ABSTRACT

A dielectric composition comprises a crystal of an oxynitride. A peak attributed to absence of a center of symmetry of the crystal of the oxynitride is detected by Raman spectroscopy of the dielectric composition within a Raman shift range of 500 $cm^{-1}$ or less.

13 Claims, 7 Drawing Sheets

DIELECTRIC COMPOSITION, CAPACITIVE ELEMENT, VISIBLE-LIGHT PHOTOCATALYTIC MATERIAL, AND VISIBLE-LIGHT PHOTOELECTRIC CONVERSION ELEMENT

TECHNICAL FIELD

The present invention relates to a dielectric composition, a capacitive element, a photocatalytic material, and a photoelectric conversion element.

BACKGROUND

Along with improving performance of digital equipment, capacitive elements are in need of even larger capacitance. As a means of increasing the capacitance of the capacitive elements, use of a dielectric composition having high dielectric properties has been studied. The dielectric composition having high dielectric properties is also required for visible-light photocatalytic materials and visible-light photoelectric conversion elements.

For example, use of a perovskite-type oxynitride (e.g., $BaTaO_2N$) described in Non-Patent Document 1 has been studied.

Non-Patent Document 1: Akira Hosono, Yuji Masubuchi, Shintaro Yasui, Masaki Takesada, Takashi Endo, Mikio Higuchi, Mitsuru Itoh, and Shinichi Kikkawa "Ferroelectric $BaTaO_2N$ Crystals Grown in a $BaCN_2$ Flux" Inorg. Chem. 58 (24) 16752-16760, 2019.

SUMMARY

It is an object of the present invention to provide a dielectric composition or the like having a good relative permittivity.

A dielectric composition according to a first aspect of the present invention comprises a crystal of an oxynitride, wherein a peak attributed to absence of a center of symmetry of the crystal of the oxynitride is detected by Raman spectroscopy of the dielectric composition within a Raman shift range of 500 $cm^{-1}$ or less.

A dielectric composition according to a second aspect of the present invention comprises a crystal of an oxynitride, wherein a peak is detected by Raman spectroscopy of the dielectric composition within a Raman shift range of 500 $cm^{-1}$ or less; and an integrated intensity of the peak decreases at 400° C. or more and 1000° C. or less.

The integrated intensity of the peak may decrease at 500° C. or more and 700° C. or less.

A dielectric composition according to a third aspect of the present invention comprises a crystal of an oxynitride, wherein a peak is detected by Raman spectroscopy of the dielectric composition within a Raman shift range of 500 $cm^{-1}$ or less; and an analysis of an angle-resolved polarized micro-Raman spectrum of the dielectric composition demonstrates that an integrated intensity of the peak has rotation angle dependency and that the crystal of the oxynitride has a crystal structure with less symmetry than a cubic crystal structure.

In the dielectric composition according to the first to third aspects of the present invention, the oxynitride may comprise a perovskite-type oxynitride.

In the dielectric composition according to the first to third aspects of the present invention, the oxynitride may comprise at least one selected from the group consisting of La, Ba, and Sr.

A capacitive element of the present invention comprises the above dielectric composition.

A visible-light photocatalytic material of the present invention comprises the above dielectric composition.

A visible-light photoelectric conversion element of the present invention comprises the above dielectric composition.

BRIEF DESCRIPTION OF THE DRAWING(S)

DETAILED DESCRIPTION

Figure 1:
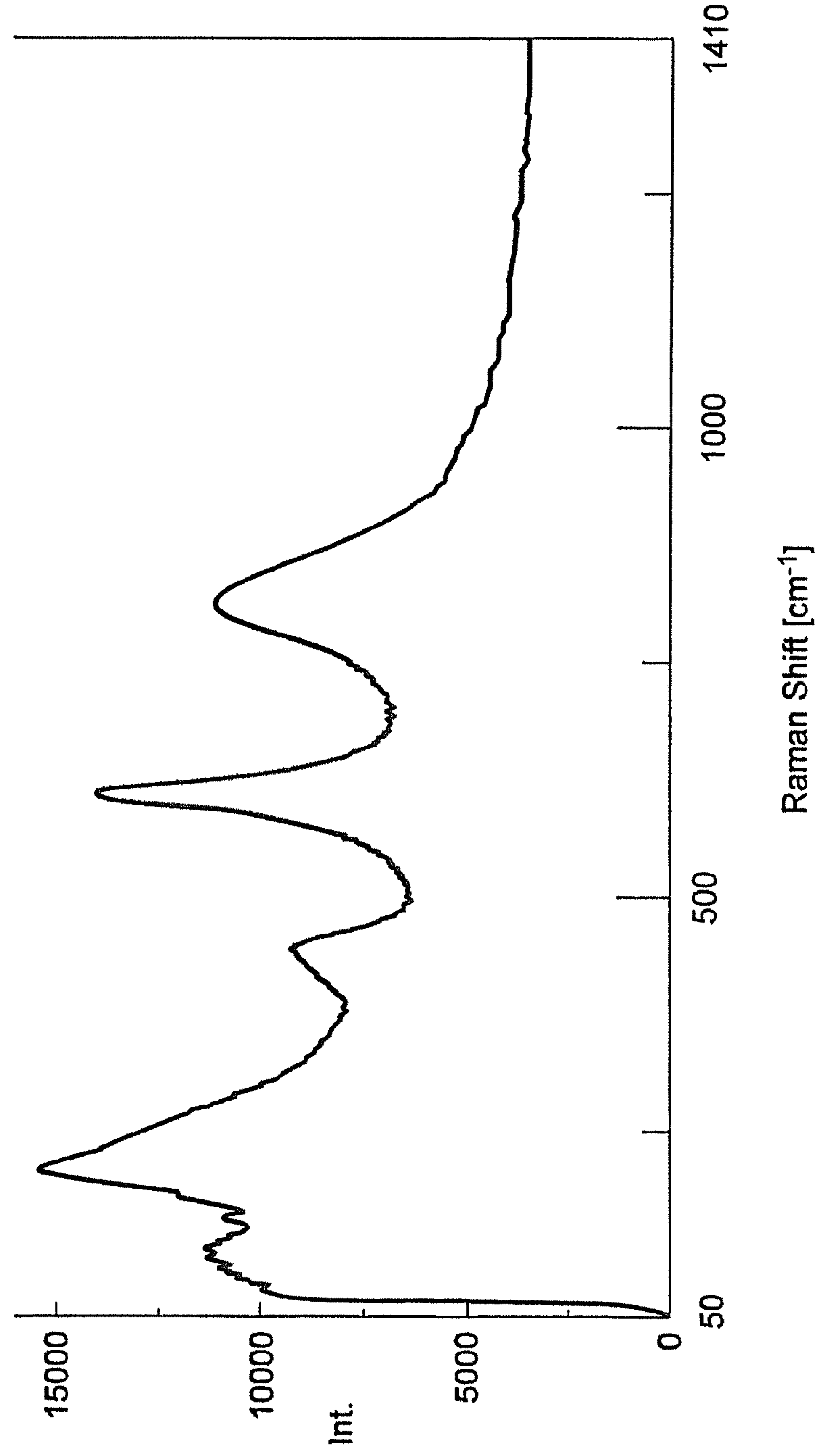
FIG. 1 is a chart showing measurement of a Raman spectrum of Example 1.

Hereinafter, the present invention will be described based on an embodiment.

A dielectric composition according to the present embodiment is a dielectric composition in which a crystal of an oxynitride (an oxynitride crystal) is contained and for which at least one peak attributed to absence of a center of symmetry of the oxynitride crystal is detected by Raman spectroscopy within a Raman shift range of 500 $cm^{-1}$ or less.

The oxynitride may be any oxynitride. For example, the oxynitride may be a perovskite-type oxynitride. The oxynitride may contain at least one selected from the group consisting of La, Ba, and Sr.

Specifically, the oxynitride may be composed of a compound represented by $A_{1+\alpha}BO_xN_y$, where "A" comprises A site ions and "B" comprises B site ions. More specifically, the oxynitride may have a composition satisfying $-0.3 \le \alpha \le 0.3$, $0<x\le 3.50$, $0<y\le 1.00$, and $6.70\le 2x+3y\le 7.30$. The sum of the average valence of the A site ions and the average valence of the B site ions may be 6.70 to 7.30.

The average valence is a value obtained by averaging the valences of ions present in the A-site and the B-site based on their abundance ratios. For example, a case will be described where Sr and La are present in the A-site at a ratio of 4:1, and Ta and Ti are present in the B-site at a ratio of 4:1. Sr ions have a valence of 2, and La ions have a valence of 3. Thus, when their average valence is represented by $X_A$, $X_A$ is calculated using Formula 1 shown below. Likewise, Ta ions have a valence of 5, and Ti ions have a valence of 4. Thus, when their average valence is represented by $X_B$, $X_B$ is calculated using Formula 2 shown below. Calculation gives a solution of $X_A$=2.2 and $X_B$=4.8. The sum ($X_A$+$X_B$) of the average valences is 7.

$X_A$=(valence of Sr ions)×(abundance ratio of Sr ions)+(valence of La ions)×(abundance ratio of La ions)=2×4/5+3×1/5=2.2 Formula 1

$X_B$=(valence of Ta ions)×(abundance ratio of Ta ions)+(valence of Ti ions)×(abundance ratio of Ti ions)=5×4/5+4×1/5=4.8 Formula 2

Even when $\alpha \neq 0$ is satisfied, the sum of the average valences of the present application is calculated as if $\alpha=0$ was satisfied. For example, in the above case, even when $\alpha=0.02$ is satisfied, the sum of the average valences is 2.2+4.8=7.0.

In the dielectric composed of the compound represented by $A_{1+\alpha}BO_xN_y$ and having a composition within the above ranges, divalent O anions and trivalent $O_{1.5}$ anions and/or trivalent N anions are orderly arranged. Note that $O_{1.5}$ is actually present in the form of $O_2$. An octahedron having O and/or N as vertices surrounding "B" and another octahedron having O and/or N as vertices surrounding another "B" share excess O.

The reason why divalent O anions and trivalent $O_{1.5}$ anions and/or trivalent N anions can be orderly arranged is that $6.70 \leq 2x+3y \leq 7.30$ is satisfied and the sum of the average valence of the A-site ions and the average valence of the B-site ions is 6.70 to 7.30.

Constituent elements of "A" and "B" are not limited. "A" may comprise one or more elements selected from La, Ba, Sr, Ca, Ce, Pr, Nd, and Na or may comprise one or more elements selected from La, Ba, and Sr. "B" may comprise one or more elements selected from Ta, Nb, Ti, and W or may comprise one or more elements selected from Ta and Ti.

Because the dielectric composition according to the present embodiment has a specific structure, distinctive results are generated in an XRD analysis of the dielectric composition and in Raman spectroscopy of the dielectric composition.

In the XRD analysis, it is confirmed that the dielectric composition according to the present embodiment contains at least one crystal. The dielectric composition according to the present embodiment may be a single-crystal solid composed of one crystal or a polycrystalline solid composed of a plurality of crystals. Whether the dielectric composition is a single-crystal solid or a polycrystalline solid is also confirmed by XRD.

In order to improve the dielectric properties of the dielectric composition containing the oxynitride crystal, particularly the dielectric properties of the dielectric composition containing the perovskite-type oxynitride crystal, it is preferable that a large bias of charge be locally generated in the oxynitride crystal in response to application of a voltage. In order to locally generate a large bias of charge in the oxynitride crystal, the oxynitride crystal preferably does not have a center of symmetry. However, it is difficult to confirm whether the oxynitride crystal has a center of symmetry.

In order to confirm whether the oxynitride crystal has a center of symmetry, it is necessary to confirm the presence or absence of the orderliness of the arrangement of the light elements contained in the oxynitride crystal, i.e., the orderliness of the arrangement of O and N contained in the oxynitride crystal. However, it is difficult to confirm the presence or absence of the orderliness of the arrangement of the light elements by XRD, because the light elements have a small scattering power with respect to X-rays.

Neutron diffraction enables confirmation of the presence or absence of the orderliness of the arrangement of the light elements contained in the oxynitride crystal. However, in order to confirm whether the oxynitride crystal has a center of symmetry, it is necessary to also confirm whether the oxynitride crystal has a locally polarized structure, which is attributed to the orderliness of the arrangement of the light elements but cannot be confirmed by neutron diffraction.

Raman spectroscopy of the dielectric composition containing the oxynitride crystal enables confirmation of whether the oxynitride crystal has a center of symmetry.

In Raman spectroscopy of the dielectric composition according to the present embodiment, a peak attributed to absence of a center of symmetry of the oxynitride crystal is detected within the Raman shift range of 500 $cm^{-1}$ or less.

Raman spectroscopy of the oxynitride crystal can generate a Raman spectrum in which each peak appears at each wavenumber corresponding to vibration energy of each lattice vibration of crystal lattices. The Raman spectrum of the oxynitride crystal can be theoretically calculated using the first-principles calculation.

The present inventors have found that a peak attributed to the vibration related to cations (e.g., vibration between cations and O and vibration between cations and N) among the lattice vibrations of the oxynitride crystal is mainly detected in the range of 500 $cm^{-1}$ or less. The present inventors have found that a peak attributed to the vibration unrelated to cations (e.g., vibration between O and O, vibration between O and N, and vibration between N and N) is mainly detected in the range of 500 $cm^{-1}$ to 1000 $cm^{-1}$. The present inventors have found that the absence of a center of symmetry of the oxynitride crystal contributes to the vibration related to cations.

Figure 2:
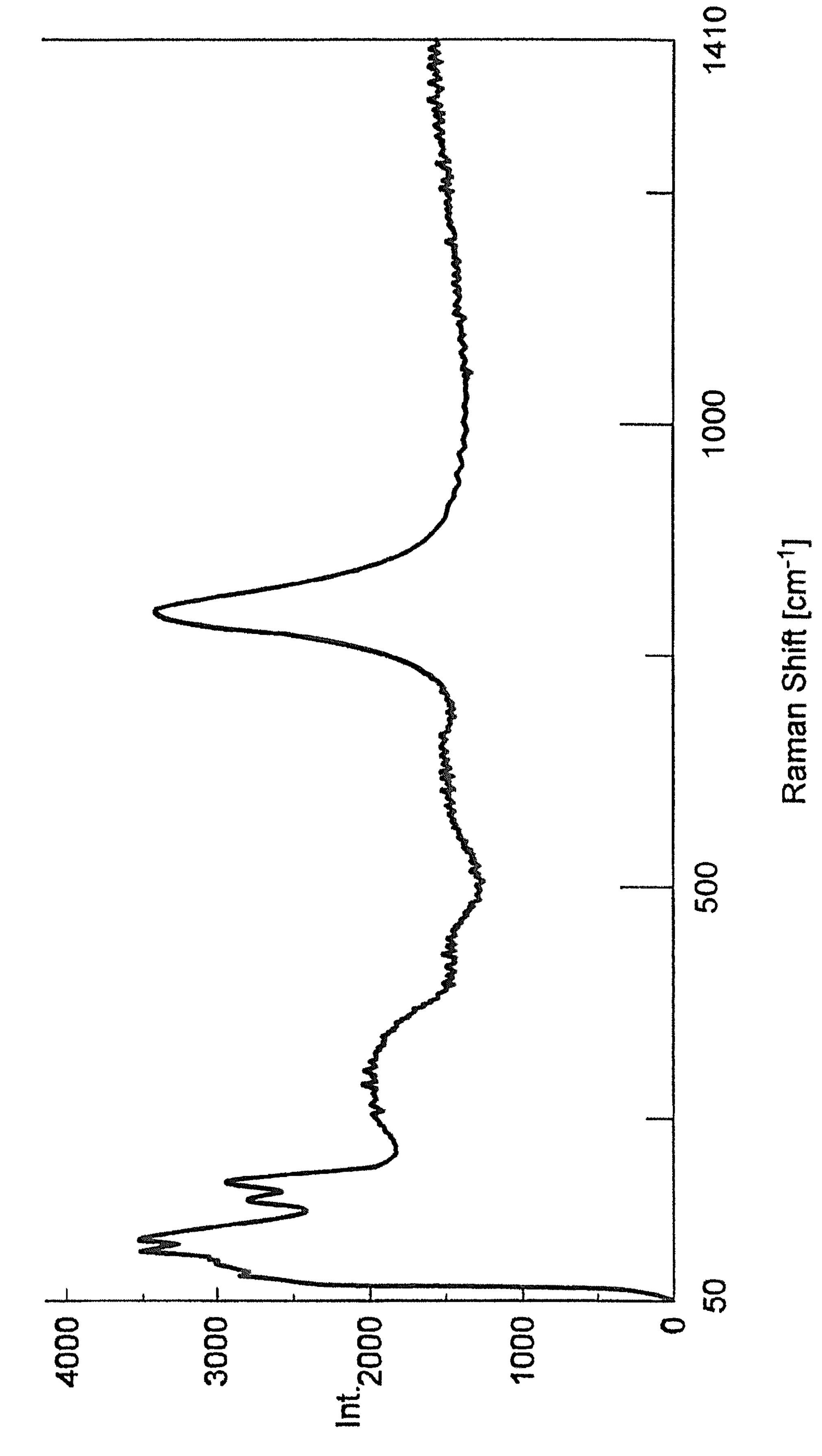
FIG. 2 is a chart showing measurement of a Raman spectrum of Comparative Example 2.
Figure 3:
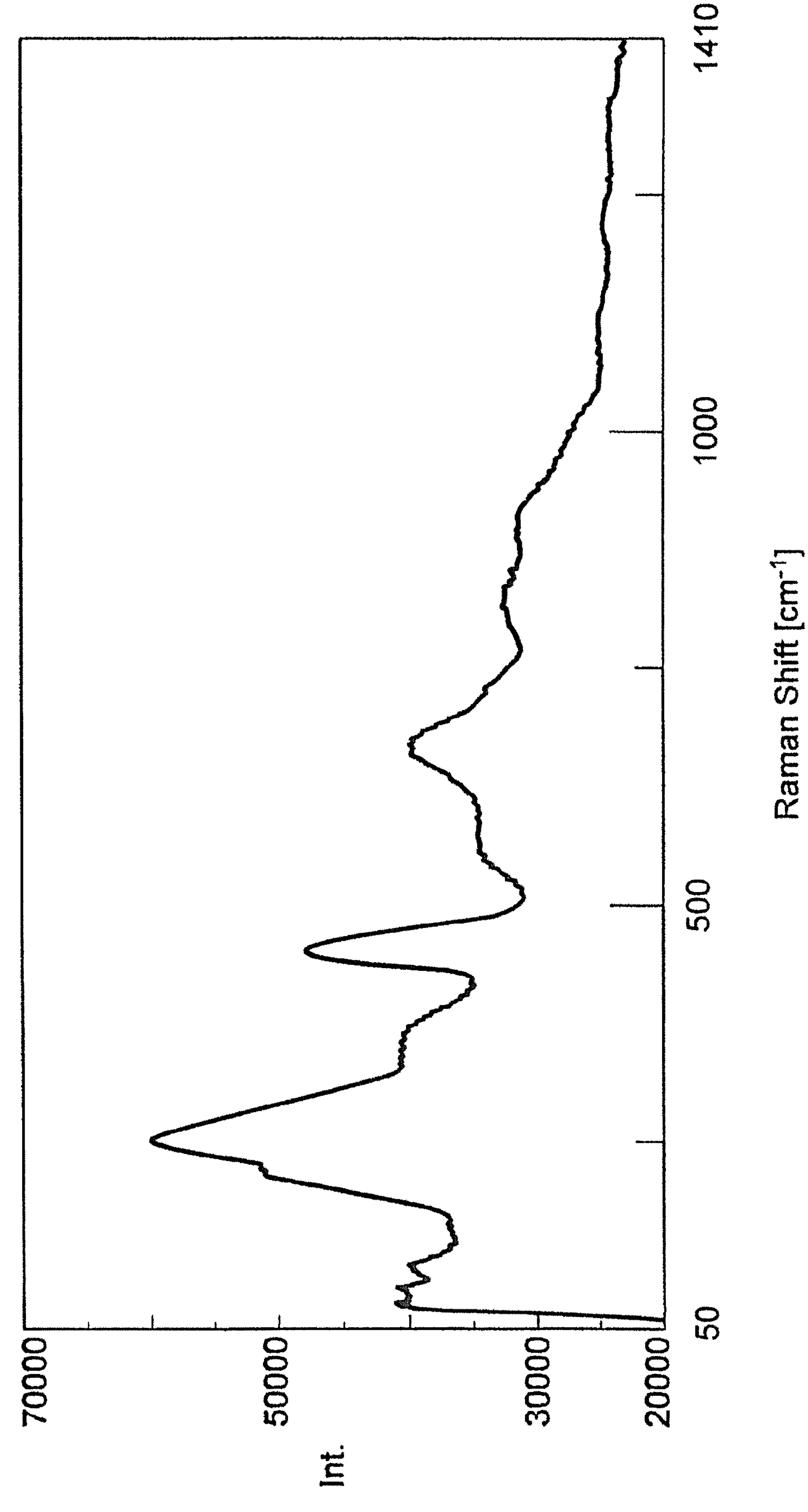
FIG. 3 is a chart showing measurement of a Raman spectrum of Example 2.

FIGS. 1 and 3 each show a Raman spectrum generated by Raman spectroscopy of a dielectric composition containing a $SrTaO_2N$ oxynitride crystal not having a center of symmetry. FIG. 2 shows a Raman spectrum generated by Raman spectroscopy of a dielectric composition containing a $SrTaO_2N$ oxynitride crystal having a center of symmetry. FIG. 1 shows test results of Example 1 (described later). FIG. 2 shows test results of Comparative Example 2 (described later). FIG. 3 shows test results of Example 2 (described later).

Figure 5:
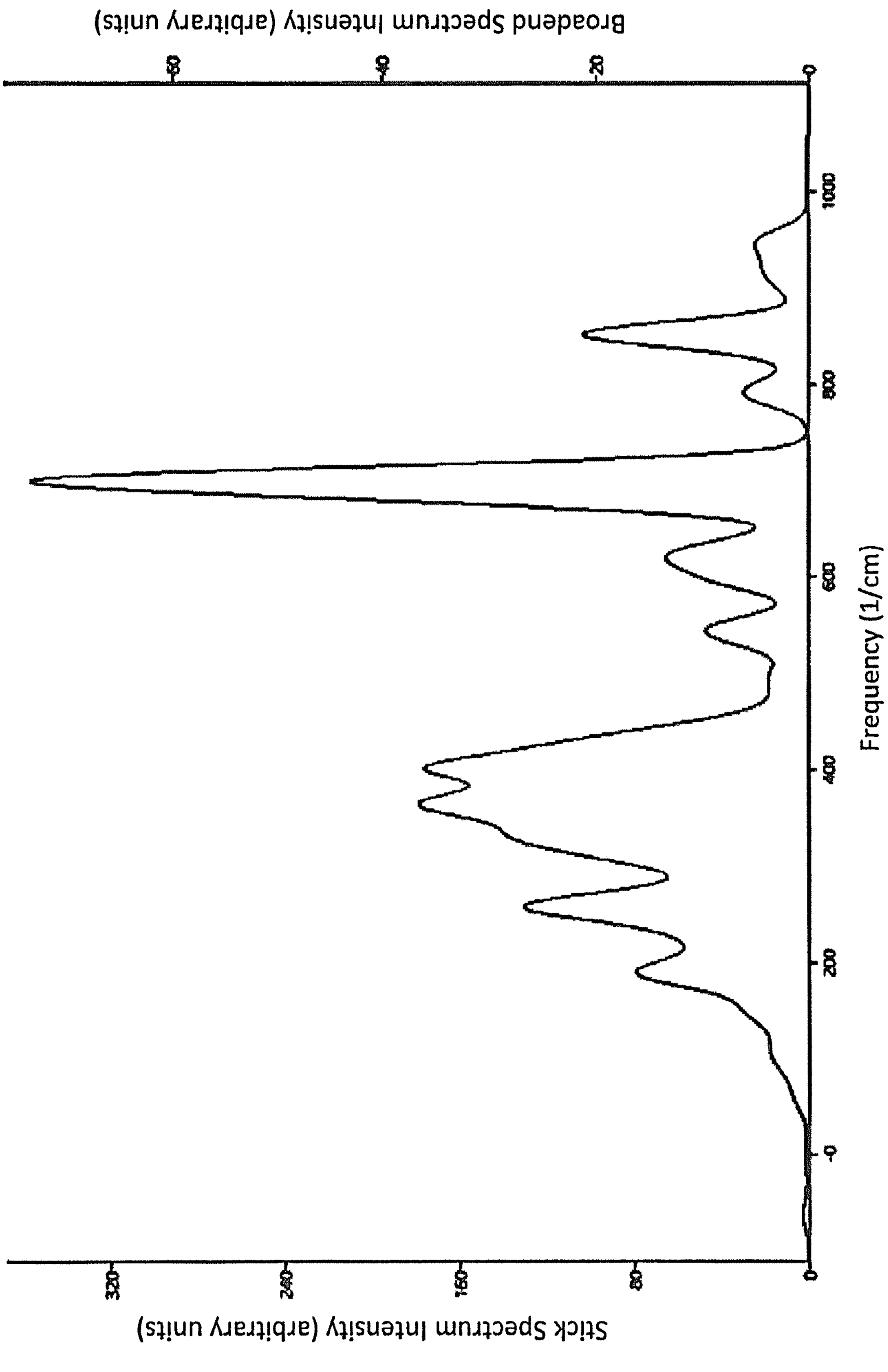
FIG. 5 is a chart showing a Raman spectrum, calculated by first-principles calculation, of a $SrTaO_2N$ crystal having no center of symmetry.

A Raman spectrum, theoretically calculated using the first-principles calculation, of a $SrTaO_2N$ crystal containing N arranged in a cis-type arrangement and not having a center of symmetry is as shown in FIG. 5. Peaks are observed at around 200 $cm^{-1}$, around 250 $cm^{-1}$, and around 400 $cm^{-1}$.

Conversely, when these peaks are observed in a Raman spectrum generated by Raman spectroscopy of an oxynitride containing a $SrTaO_2N$ crystal, it can be deduced that these peaks are peaks attributed to absence of a center of symmetry of the oxynitride crystal and that the oxynitride crystal does not have a center of symmetry. For example, in FIGS. 1 and 3, peaks are observed at around 200 $cm^{-1}$, around 250 $cm^{-1}$, and around 400 $cm^{-1}$. A large peak is observed at particularly around 200 $cm^{-1}$ in FIG. 1 and particularly around 250 $cm^{-1}$ in FIG. 3. In contrast, peaks are not observed at around 200 $cm^{-1}$, around 250 $cm^{-1}$, or around 400 $cm^{-1}$ in FIG. 2.

A method of confirming whether a peak detected within the range of 500 $cm^{-1}$ or less is a peak attributed to absence of a center of symmetry of the oxynitride crystal will be described next.

The present inventors have found a method of measuring a temperature-rising Raman spectrum of the dielectric composition by temperature-rising in-situ Raman measurement. Temperature-rising in-situ Raman measurement is measurement of a Raman spectrum by Raman spectroscopy while the temperature of the dielectric composition is being increased. Temperature-rising in-situ Raman measurement generates, for example, a temperature-rising Raman spectrum shown in FIG. 4.

In temperature-rising in-situ Raman measurement of the dielectric composition, the dielectric composition may expand as its temperature increases. When the dielectric composition expands, a Raman laser may be out of focus. As the temperature increases, the Raman laser becomes out of focus, which may result in increase of the peak intensities of the peaks included in the Raman spectrum as a whole. In such a case, Raman spectra at different temperatures cannot be appropriately compared.

In order to appropriately compare Raman spectra at different temperatures even in the above case, the Raman spectra may be normalized at a wavenumber at which no peak is observed.

Figure 4:
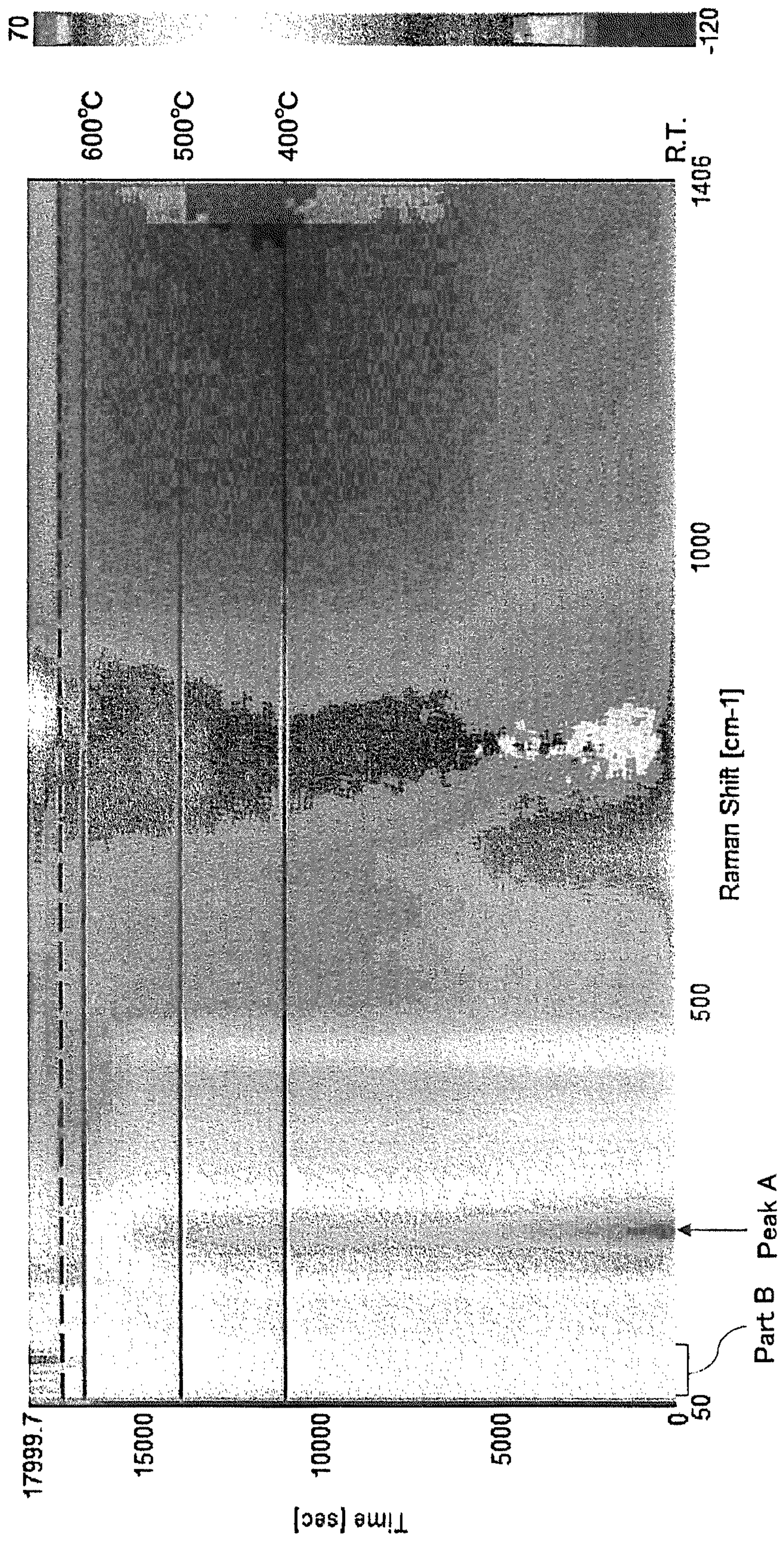
FIG. 4 is a chart showing measurement of a temperature-rising Raman spectrum of Example 2.

FIG. 4 shows test results of Example 2 (described later). In FIG. 4, the horizontal axis represents the wavenumber, and the vertical axis represents elapsed time. The temperature of the dielectric composition reaches 200° C. in 5,000 seconds and reaches 550° C. in 15,000 seconds. It is assumed that $H_2O$ adsorbed to the dielectric composition is released at about 200° C. It is assumed that part of N contained in the dielectric composition is released as $N_2$ at about 550° C.

As shown in FIG. 4, the present inventors have found that the integrated intensity of a peak attributed to absence of a center of symmetry of the oxynitride crystal contained in the dielectric composition decreases at 400° C. or more and 1000° C. or less, at 500° C. or more and 700° C. or less, or at 500° C. or more and 600° C. or less. In contrast, the present inventors have found that the integrated intensity of a peak (e.g., a peak contained in a region where the wavenumber is smaller than 200 $cm^{-1}$) that is not attributed to absence of a center of symmetry of the oxynitride crystal contained in the dielectric composition does not decrease at 1000° C. or less, at 700° C. or less, or at 600° C. or less.

If the integrated intensities of all peaks in the Raman spectrum decrease due to the temperature rise, it is also assumed that the dielectric composition itself is decomposed due to the temperature rise. For example, at a temperature higher than 1000° C. or a temperature higher than 700° C., the dielectric composition itself may be decomposed depending on the type of the dielectric composition. However, the present inventors have found that, when the temperature-rising Raman spectrum of the dielectric composition is measured by temperature-rising in-situ Raman measurement, at 400° C. or more and 1000° C. or less, at 500° C. or more and 700° C. or less, or at 500° C. or more and 600° C. or less, only the integrated intensity of the peak attributed to absence of a center of symmetry of the oxynitride crystal contained in the dielectric composition decreases, and only the peak attributed to absence of a center of symmetry of the oxynitride crystal contained in the dielectric composition disappears. That is, it is assumed that the decrease in the integrated intensity of the peak and the disappearance of the peak due to the temperature rise are attributed to the structural change related to the orderliness of the arrangement of O and N.

In a case where the integrated intensity of the peak attributed to absence of a center of symmetry of the oxynitride crystal contained in the dielectric composition decreases or where the peak attributed to absence of a center of symmetry of the oxynitride crystal contained in the dielectric composition disappears in temperature-rising in-situ Raman measurement, returning the temperature to room temperature does not increase the integrated intensity of the peak nor restore the disappeared peak. That is, the structural change related to the orderliness of the arrangement of O and N due to the temperature rise is irreversible. The dielectric composition after the temperature rise is inferior in dielectric properties to the dielectric composition before the temperature rise.

The rate of decrease in the integrated intensity of the peak attributed to absence of a center of symmetry of the oxynitride crystal contained in the dielectric composition may be any rate. For example, the integrated intensity of the peak at any temperature from 400° C. to 1000° C. may be reduced by 50% or more or by 20% or more from the integrated intensity of the peak at room temperature. Alternatively, the integrated intensity of the peak at any temperature from 500° C. to 700° C. may be reduced by 20% or more or by 10% or more from the integrated intensity of the peak at room temperature.

When the dielectric composition is a single-crystal solid of the oxynitride, the fact that the dielectric composition is a single-crystal solid of the oxynitride can be confirmed by angle-resolved polarized micro-Raman spectroscopy. The single-crystal solid may have any size. For example, the single-crystal solid may have a size of about several m.

By performing angle-resolved polarized micro-Raman spectroscopy of the dielectric composition for which a peak is detected within the range of 500 $cm^{-1}$ or less in normal Raman spectroscopy, it can be confirmed that the integrated intensity of the peak has an oxynitride crystal rotation angle dependency and that the oxynitride crystal has a crystal structure with less symmetry than the cubic crystal structure.

Figure 6:
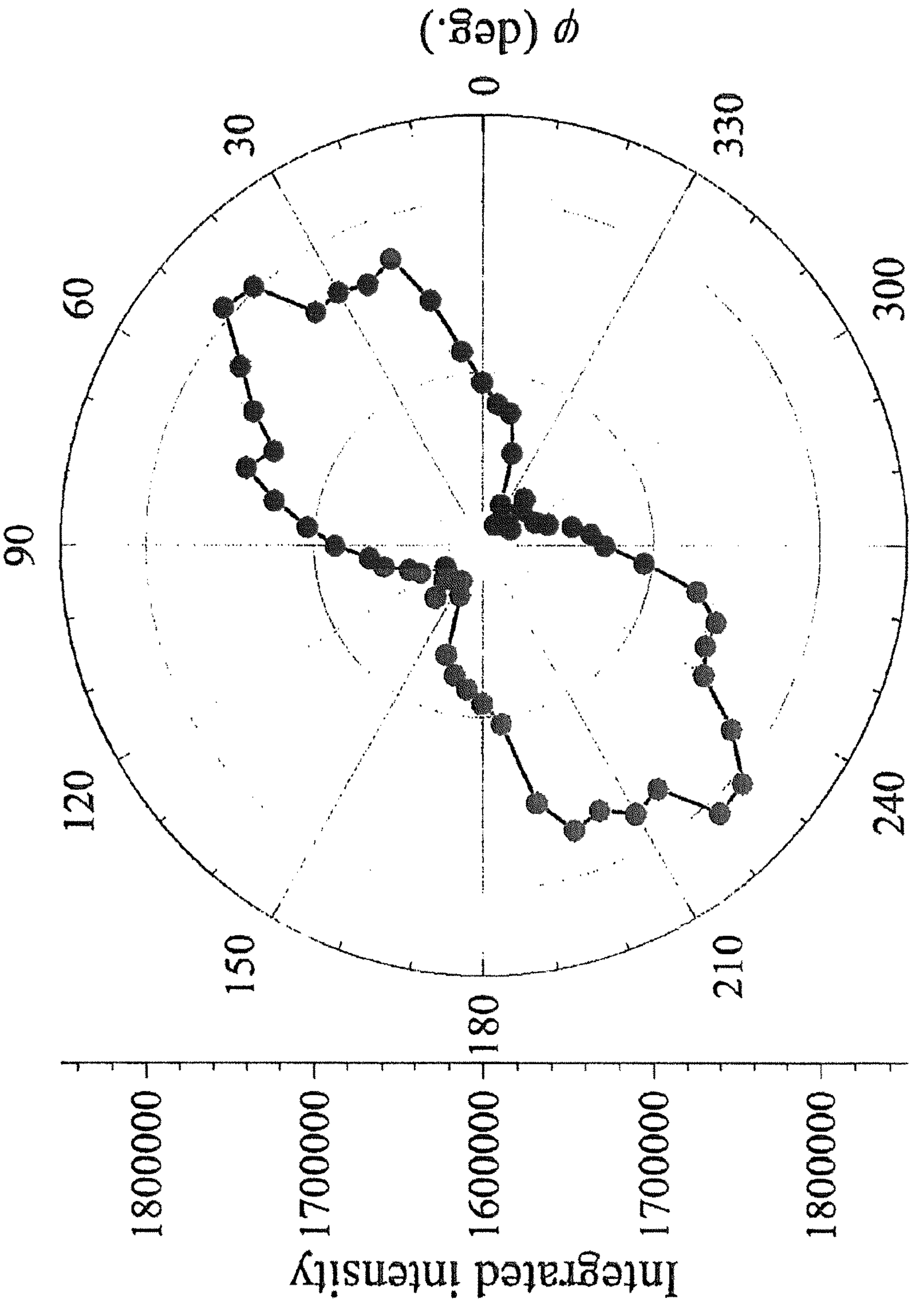
FIG. 6 is a chart showing results of analyzing an angle-resolved polarized micro-Raman spectrum of a single-crystal solid with parallel nicols.
Figure 7:
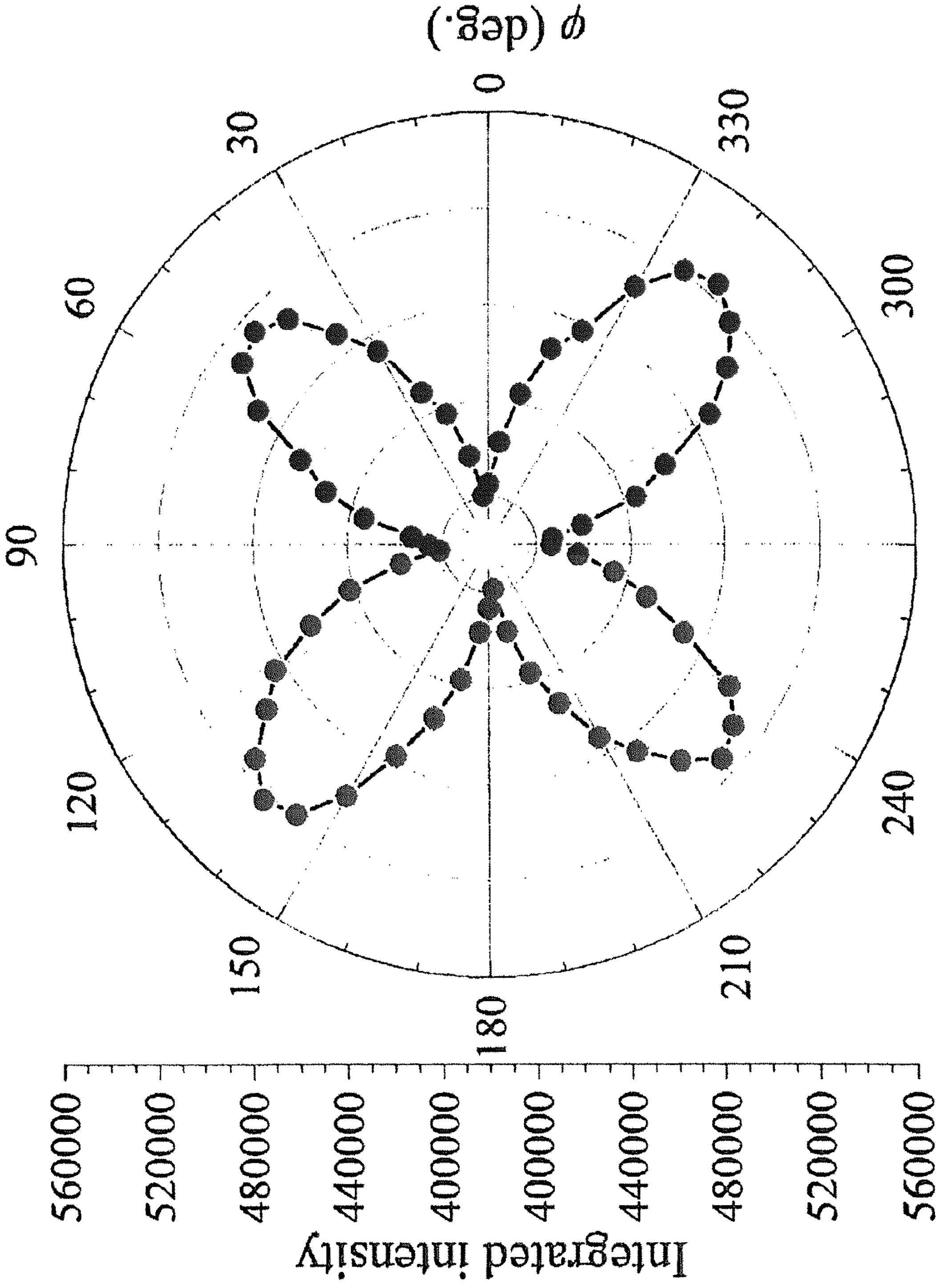
FIG. 7 is a chart showing results of analyzing the angle-resolved polarized micro-Raman spectrum of the single-crystal solid with crossed nicols.

FIGS. 6 and 7 show the results of observing changes in the integrated intensity of a peak detected in the range of 500 $cm^{-1}$ or less by angle-resolved polarized micro-Raman spectroscopy of, for example, a $BaTaO_2N$ oxynitride crystal not having a center of symmetry. FIG. 6 is a chart showing results of analyzing an angle-resolved polarized micro-Raman spectrum of the single-crystal solid with parallel nicols. FIG. 7 is a chart showing results of analyzing the angle-resolved polarized micro-Raman spectrum of the single-crystal solid with crossed nicols.

FIG. 6 indicates that the $BaTaO_2N$ oxynitride crystal has a two-fold symmetrical polarization inclined by 45 degrees from the lattice axis of a basic cubic perovskite structure, i.e., the integrated intensity of the peak has the oxynitride crystal rotation angle dependency. FIG. 6 indicates that the $BaTaO_2N$ oxynitride crystal has a locally polarized crystal structure different from the cubic crystal structure, i.e., that the $BaTaO_2N$ oxynitride crystal has a crystal structure with less symmetry than the cubic crystal structure. Specifically, FIG. 6 indicates that the $BaTaO_2N$ oxynitride crystal has a locally orthorhombic structure, and the direction of the polarization axis is the dihedral direction of an octahedral $TaO_4N_2$ equatorial plane containing cis-type N arrangement. That is, FIG. 6 indicates that the $BaTaO_2N$ oxynitride crystal does not have a center of symmetry. FIG. 6 also indicates that the crystal structure of the single-grain crystal of $BaTaO_2N$ which has an orthorhombic crystal structure having no center of symmetry is more distorted than the cubic crystal structure having a center of symmetry.

When the dielectric composition is a polycrystalline solid of the oxynitride, it is not possible to use the method of confirming by angle-resolved polarized micro-Raman spectroscopy whether a peak detected within the range of 500 $cm^{-1}$ or less is a peak attributed to absence of a center of symmetry of the oxynitride crystal. This is because angle-resolved polarized micro-Raman spectroscopy of a polycrystalline solid generates results in which test results of crystals having different orientations are superimposed.

Methods of Manufacturing Dielectric Composition

Methods of manufacturing the dielectric composition according to the present embodiment will be described next.

First, a method of manufacturing the dielectric composition having a thin film shape, i.e., a method of manufacturing a dielectric thin film, will be described.

Any method may be used to form a thin film that becomes the dielectric thin film in the end. Examples of the methods include a pulsed laser deposition (PLD) method and a sputtering method. Although raw materials used for film formation may include trace amounts of impurities and subcomponents, this inclusion is not a problem as long as they are too little in amount to significantly impair the performance of the thin film.

The dielectric thin film may be formed on any location. The location may be appropriately selected according to the purpose. For example, the dielectric thin film may be formed on a substrate or metal (e.g., an electrode).

Hereinafter, a method of forming the dielectric thin film by the PLD method will be described.

First, a target is produced. Any method may be used to produce the target, and a known method may be used. The target may be of any type. Other than a metal oxide sintered body containing the constituent metal elements of the dielectric thin film to be produced, an alloy, a nitride sintered body, a metal oxynitride sintered body, or the like can be used. Although each element is preferably evenly distributed in the target, the distribution may be uneven as long as the quality of the dielectric thin film to be produced is not affected. The number of the target is not necessarily one, and a plurality of targets including some of the constituent elements of the dielectric thin film may be prepared and can be used for film formation. The target may have any shape suitable for a film formation apparatus to be used.

Next, a PLD system with a radical generator is prepared. Then, the dielectric thin film is formed while $N_2$ radicals are being supplied from the radical generator. If necessary, the location on which the film is formed may be heated.

The present inventors have found that a slow film formation rate makes the oxynitride crystal have no center of symmetry. Specifically, the film formation rate may be 8 nm/min or less, 7 nm/min or less, 2 nm/min or more and 8 nm/min or less, or 2 nm/min or more and 7 nm/min or less. It has been assumed that such a slow film formation rate of the dielectric thin film containing the oxynitride is not preferable because of low manufacturing efficiency and the magnitude of damage to the substrate and its lower electrode due to film formation. However, the present inventors have found that such a slow film formation rate enables the oxynitride crystal contained in the dielectric thin film after annealing (described later) to have no center of symmetry. The inventors have found that this increases the relative permittivity of the dielectric thin film.

The dielectric thin film may have any thickness. For example, the thickness may be 0.05 μm or more and 2 μm or less.

The dielectric thin film after being formed is annealed. Annealing may be performed under any atmosphere. For example, an atmosphere in which $O_2$ and $N_2$ coexist may be used. Annealing advances crystallization of the oxynitride contained in the dielectric thin film to give a polycrystalline solid of the oxynitride. Annealing may be performed at any temperature at which crystallization of the oxynitride sufficiently proceeds and centers of symmetry of the oxynitride crystals are not generated. The annealing temperature may be changed in accordance with conditions such as the annealing atmosphere. For example, the annealing temperature may be 300° C. to 750° C. in a nitrogen atmosphere that does not substantially contain oxygen or may be 200° C. to 450° C. in an atmosphere containing oxygen. Annealing may be performed for any amount of time. For example, the time may be 1 minute to 60 minutes.

Hereinafter, a method of forming the dielectric thin film by the sputtering method will be described. What is not particularly described is the same as in the method of forming the dielectric thin film by the PLD method.

After the target is produced, a radio frequency (RF) sputtering apparatus is prepared. Then, the dielectric thin film is formed. Any type of gas may be used for film formation. A gas (e.g., $N_2$ gas) containing nitrogen is always used. Other gases may be appropriately selected from gases such as an Ar gas and an $O_2$ gas. Using the gas (e.g., $N_2$ gas) containing nitrogen enables the N element to be contained in the atmosphere. When the N element is contained in the atmosphere, nitridation of the oxide proceeds at the same time as the dielectric thin film is formed to give the dielectric thin film containing the oxynitride crystal.

When the dielectric thin film is formed by the sputtering method, the film may be formed at any film formation rate. Reducing the power of the RF plasma during RF sputtering makes the oxynitride crystal have no center of symmetry. Specifically, the power of the RF plasma may be 50 W to 120 W. When the power of the RF plasma during film formation is at such a low level, the film formation rate is likely to be slow. It has been assumed that lowering the film formation rate by reducing the power of the RF plasma is not preferable because of low manufacturing efficiency and increasing damage to the substrate and the lower electrode due to the energy applied during film formation along with increasing film formation time. However, the present inventors have found that such a low level of power enables the oxynitride crystal contained in the dielectric thin film after annealing (described later) to have no center of symmetry. The inventors have found that this increases the relative permittivity of the dielectric thin film.

The location (film formation location) on which the film is formed may be heated during film formation. Specifically, the film formation location may have a temperature ranging from room temperature to 750° C. When the power of the RF plasma is low as described above, too low a temperature of the film formation location prevents generation of the oxynitride crystal in the dielectric thin film, and the dielectric thin film becomes an amorphous dielectric. The appropriate temperature of the film formation location varies depending on conditions such as the type of the oxynitride. Thus, room temperature may be too low as the temperature of the film formation location.

When the dielectric thin film is formed by RF sputtering, it is not necessary to perform annealing, unlike when the dielectric thin film is formed by the PLD method. Annealing may be performed in the same manner as in the case of forming the dielectric thin film by the PLD method.

A method of manufacturing the dielectric composition in bulk (e.g., in a form of a sintered body) will be described next.

First, an oxynitride powder is prepared. Any method of preparing the oxynitride powder may be used. For example, an oxide powder precursor that becomes an oxynitride through a nitriding reaction is prepared, and then the oxide powder precursor is subjected to a nitriding reaction to give the oxynitride powder. Any method of nitriding may be used.

The oxynitride powder is then molded to give a powder compact. The powder compact at this time may have a density lower than a normal density, or the sintered body to be obtained in the end may have a relative density of 60% or less. The relative density of the sintered body has no lower limit and is, for example, 40% or more.

The powder compact is then fired to give the sintered body. Firing may be performed under any conditions. For example, the firing temperature is 1000° C. to 1400° C.; the firing time is 1 hour to 16 hours; and the nitrogen partial pressure in the firing atmosphere is 0.1 MPa to 1 MPa. Although part of nitrogen in the oxynitride is released by firing, the nitrogen partial pressure in the firing atmosphere within the above range, particularly 0.1 MPa or more, enables the amount of nitrogen released to be controlled.

Annealing is then performed while ammonia is being supplied. When the density of the sintered body is sufficiently low, performing annealing while ammonia is being supplied enables ammonia to be supplied to the sintered body throughout. Nitrogen, which has been released during firing, is supplied to the sintered body throughout, and at least part of the oxide that has resulted from firing becomes the oxynitride. By performing annealing while ammonia is being supplied, the oxynitride crystal having no center of symmetry such that a peak attributed to absence of a center of symmetry of the oxynitride crystal is detected by Raman spectroscopy is generated. Ammonia may be supplied at any supply rate. The supply rate is, for example, 50 mL/min to 200 mL/min. The annealing temperature is not limited and is, for example, 700° C. to 1000° C.

Normally, the density of the sintered body is preferably high. However, when the density of the sintered body is too high in the present embodiment, performing annealing while ammonia is being supplied would not readily supply ammonia to, particularly, the inside of the sintered body. Consequently, a peak attributed to absence of a center of symmetry of the oxynitride crystal is not detected by Raman spectroscopy of the sintered body, and the sintered body does not have a desired relative permittivity.

Although the embodiment of the present invention has been described above, the present invention is not at all limited to the embodiment. The present invention may be put into practice in various forms without departing from the scope of the invention.

Capacitive elements according to the present invention are elements having dielectric properties. The capacitive elements include capacitors, filters, and memories. Including the above dielectric composition in the capacitive elements enables them to have more suitable characteristics.

Visible-light photocatalytic materials according to the present invention are materials in which electrons and holes are generated on surfaces of the materials when they are exposed to visible light. The visible-light photocatalytic materials include water decomposition visible-light photocatalysts and organic decomposition catalysts. The visible-light photocatalytic materials may also be referred to as visible-light responsive photocatalytic materials. Including the above dielectric composition in the visible-light photocatalytic materials enables them to have more suitable characteristics.

Visible-light photoelectric conversion elements according to the present invention are photoelectric conversion elements that respond to visible light and output an electric signal corresponding to the amount of visible light reaching the elements. The visible-light photoelectric conversion elements are used in, for example, solar cells and image sensors. Including the above dielectric composition in the visible-light photoelectric conversion elements enables them to have more suitable characteristics.

EXAMPLES

Hereinafter, the present invention will be described based on more detailed examples, but the present invention is not limited to these examples.

Experiment 1

Example 1

In Example 1, a target with a composition of $Sr_2Ta_2O_7$ was prepared as a film formation target.

The film formation target was then placed in a PLD system, and a Si/Pt substrate was placed so as to face the film formation target. The Si/Pt substrate was a Si substrate having a Pt film as a lower electrode on a surface of the Si substrate.

Then, a dielectric thin film was formed by a PLD method so as to have a thickness of 0.4 μm. In order to form a dielectric thin film composed of $SrTaO_2N$, which was a perovskite-type oxynitride, $N_2$ radicals were supplied from a radical generator attached to the PLD system at the same time as the film was formed. The film formation rate was 4 nm/min.

After film formation, annealing was performed at 700° C. for 20 minutes. The annealing atmosphere was an atmosphere in which $O_2$ and $N_2$ coexisted at a molecular number ratio of $O_2$:$N_2$=2:1.

The relative permittivity of the dielectric thin film was measured. In preparation for measurement of the relative permittivity, Ag was deposited as an upper electrode on the dielectric thin film. The upper electrode had a circular shape with a diameter of 100 μm. An AC voltage was applied to the dielectric thin film having the upper electrode with an LCR meter Agilent E4980A to measure the capacitance. Specifically, the AC voltage was applied such that the reference temperature was 25° C., the frequency was 1 kHz, and the electric field was 0.5 Vrms/μm, to measure the capacitance. The relative permittivity was calculated from the capacitance and the thickness of the dielectric thin film. Table 1 shows the results. A relative permittivity of 500 or more was deemed good.

Subsequently, a Raman spectrum was measured by laser Raman spectroscopy and analyzed. The Raman spectrum of a portion of the dielectric thin film where the upper electrode was not formed was measured by laser Raman spectroscopy with NRS-7100 (JASCO Corporation). The measurement wavenumber was 50 $cm^{-1}$ to 1400 $cm^{-1}$. The exposure time was 120 seconds. The number of integrations was 2. FIG. 1 was the chart generated. Furthermore, the presence or absence of a peak attributed to absence of a center of symmetry of a crystal of the oxynitride (an oxynitride crystal) contained in the dielectric thin film was confirmed. Specifically, the presence or absence of a peak at around 200 $cm^{-1}$ was checked. Table 1 shows the results.

Subsequently, whether the dielectric thin film contained the oxynitride crystal was confirmed by XRD (SmartLab, an automated multipurpose horizontal X-ray diffractometer manufactured by Rigaku Corporation). Table 1 shows the results.

TABLE 1

| | Composition | Peak(s) attributed to absence of center of symmetry | Crystalline or amorphous | Relative permittivity of thin film |
|---|---|---|---|---|
| Example 1 | $SrTaO_2N$ | Available | Crystalline | 1500 |
| Comparative Example 1 | $SrTaO_2N$ | Unavailable | Crystalline | 400 |
| Example 2 | $SrTaO_2N$ | Available | Crystalline | 900 |
| Comparative Example 2 | $SrTaO_2N$ | Unavailable | Crystalline | 100 |
| Example 3 | $LaTiO_2N$ | Available | Crystalline | 1100 |
| Comparative Example 3 | $LaTiO_2N$ | Unavailable | Amorphous | 100 |

According to Table 1 and FIG. 1, the dielectric thin film of Example 1 had at least one peak attributed to absence of a center of symmetry of the oxynitride crystal and had a good relative permittivity.

Comparative Example 1

The experiment was conducted as in Example 1 except that the film formation rate was 15 nm/min. Table 1 shows the results.

According to Table 1, the dielectric thin film of Comparative Example 1 did not have a peak attributed to absence of a center of symmetry and did not have a good relative permittivity.

Example 2

The film formation method was changed from that of Example 1 to an RF sputtering method in which an RF sputtering apparatus was used. The gases used for film formation were an Ar gas and a $N_2$ gas. The amount of the Ar gas supplied was 100 mL/min. The amount of the $N_2$ gas supplied was 40 mL/min. The power of the RF plasma was 100 W. The substrate temperature during RF sputtering was 700° C. Annealing after film formation was not performed. Other conditions were the same as in Example 1. Table 1 and FIG. 3 show the results.

Comparative Example 2

The experiment was conducted as in Example 2 except that the power of the RF plasma was 200 W. Table 1 and FIG. 2 show the results.

Example 3

The experiment was conducted as in Example 2 except that a target with a composition of $La_2Ti_2O_7$ was prepared as a film formation target to form a dielectric thin film composed of $LaTiO_2N$, which was a perovskite-type oxynitride. Table 1 shows the results.

Comparative Example 3

The experiment was conducted as in Example 3 except that the substrate temperature during film formation was room temperature. Table 1 shows the results.

According to Table 1, it was confirmed that the dielectric thin film of each Example contained the oxynitride crystal and that at least one peak attributed to absence of a center of symmetry of the oxynitride crystal was detected within a Raman shift range of 500 $cm^{-1}$ or less. Further, the dielectric thin film of each Example had a better relative permittivity than that of each Comparative Example in which a peak attributed to absence of a center of symmetry of the oxynitride crystal was not detected within the Raman shift range of 500 $cm^{-1}$ or less.

Experiment 2

Example 4

In Experiment 2, a dielectric powder composed of $SrTaO_2N$, which was a perovskite-type oxynitride, was produced. A solid phase reaction method was used to produce the dielectric powder.

As raw material powders of the dielectric powder, a strontium carbonate ($SrCO_3$) powder and a tantalum oxide ($Ta_2O_5$) powder were prepared. The raw material powders were weighed so that the amounts of substances were substantially the same between Sr and Ta. The mixture of the $SrCO_3$ powder and the $Ta_2O_5$ powder was heated to give a $Sr_2Ta_2O_7$ precursor. The heating temperature was 1200° C., and heating was performed for 25 hours while the mixture was being pulverized at intervals of 10 hours. The heating atmosphere was air.

The $Sr_2Ta_2O_7$ precursor was subjected to a nitriding reaction to give the dielectric powder composed of $SrTaO_2N$, which was a perovskite-type oxynitride. A rotary kiln furnace was used for the nitriding reaction. The $Sr_2Ta_2O_7$ precursor was heated while $NH_3$ was being supplied into the furnace at 100 mL/min to give the dielectric powder composed of $SrTaO_2N$. The heating temperature was 1000° C., and heating was performed for 100 hours while the precursor was being pulverized at intervals of 30 hours.

The dielectric powder was subjected to cold isostatic pressing (CIP) molding to give a cylindrical powder compact having a diameter of 5.2 mm and a thickness of 1.7 mm. The pressure during CIP molding was 150 MPa.

The powder compact was fired and annealed to give a sintered body composed of $SrTaO_2N$. The firing atmosphere was an $N_2$ atmosphere with a nitrogen partial pressure of 0.2 MPa. Firing was performed at 1400° C. for 3 hours. Annealing was performed at 1000° C. for 12 hours while $NH_3$ was being supplied at 50 mL/min.

The relative density of the sintered body was measured. Specifically, the measured density calculated from the volume and the mass of the sintered body was divided by the calculated density identified in the Inorganic Crystal Structure Database (ICSD 95373) to measure the relative density. The calculated density of $SrTaO_2N$ was 7.99 $g/cm^3$.

The relative permittivity of the oxynitride contained in the sintered body was calculated based on the logarithmic mixture formula. Specifically, $\varepsilon_1$ was calculated using $\log \varepsilon = V_1 \log \varepsilon_1 + V_2 \log \varepsilon_2$, where $\varepsilon$ was the relative permittivity of the sintered body, $\varepsilon_1$ was the relative permittivity of the oxynitride contained in the sintered body, $V_1$ was the volume fraction of the oxynitride contained in the sintered body, $\varepsilon_2$ was the relative permittivity of the air contained in the sintered body, and $V_2$ was the volume fraction of the air contained in the sintered body. The relative permittivity $\varepsilon$ of the sintered body was measured with the LCR meter Agilent E4980A. The relative permittivity $\varepsilon_2$ of the air was 1. The relative density of the sintered body measured by the above method was 60%. Thus, $V_1=0.60$ and $V_2=0.40$ were given.

Subsequently, a Raman spectrum was measured by laser Raman spectroscopy and analyzed. The Raman spectrum was measured by laser Raman spectroscopy as in Experiment 1. The presence or absence of a peak attributed to absence of a center of symmetry of the oxynitride crystal was confirmed in the generated chart. Specifically, the presence or absence of a peak at around 200 $cm^{-1}$ was checked. Table 2 shows the results.

Subsequently, whether the sintered body contained the oxynitride crystal was confirmed by XRD (SmartLab, an automated multipurpose horizontal X-ray diffractometer manufactured by Rigaku Corporation). Table 2 shows the results.

TABLE 2

| | Composition | Peak(s) attributed to absence of center of symmetry | Availability of crystal(s) | Relative permittivity of oxynitride |
|---|---|---|---|---|
| Example 4 | $SrTaO_2N$ | Available | Available | 2500 |

According to Table 2, it was confirmed that the sintered body of Example 4 contained the oxynitride crystal, and at least one peak attributed to absence of a center of symmetry of the oxynitride crystal was detected within the Raman shift range of 500 $cm^{-1}$ or less. The sintered body of Example 4 had a good relative permittivity.

Experiment 3

A temperature-rising Raman spectrum of the dielectric thin film of Example 2 of Experiment 1 was measured by temperature-rising in-situ Raman measurement.

In temperature-rising in-situ Raman measurement, the dielectric thin film was set on a heating jig that accompanied NRS-7100 (JASCO Corporation), and the temperature of the dielectric thin film was changed while the Raman spectrum thereof was being measured in a closed air atmosphere without any flowing gas. Specifically, the temperature was increased from room temperature (R.T.) to 600° C. at 2° C./min and was maintained at 600° C. for 10 minutes. Then, the dielectric thin film was cooled to room temperature at 200° C./min.

FIG. 4 shows the results of temperature-rising in-situ Raman measurement. The results shown in FIG. 4 are measurement results normalized at a wavenumber of less than 200 $cm^{-1}$ where no peak is observed (e.g., a valley between peaks). A spectra manager (JASCO Corporation) was used as software for normalization. The vertical axis represents the elapsed time from the start of temperature rise. The temperature of the dielectric composition reached 200° C. in approximately 5,000 seconds and reached 550° C. in approximately 15,000 seconds. Cooling started at approximately 17,000 seconds.

FIG. 4 shows the elapsed time at which the temperature reached 400° C., 500° C., and 600° C. FIG. 4 further shows the elapsed time at which the temperature started to decrease in a broken line. From the time when the temperature reached 600° C. to the time when the temperature started to decrease, the temperature was maintained at 600° C.

As shown in FIG. 4, the integrated intensity of the peak (peak A in FIG. 4) at around 200 $cm^{-1}$ decreased in approximately 15,000 seconds. That is, it was confirmed that the peak at around 200 $cm^{-1}$ was a peak attributed to absence of a center of symmetry of the oxynitride crystal. Among the peaks within the Raman shift range of 500 $cm^{-1}$ or less, the integrated intensities of the peaks other than the peak at around 200 $cm^{-1}$ also decreased by heating. That is, it was confirmed that these peaks were also peaks attributed to absence of a center of symmetry of the oxynitride crystal. Also, the peak intensity of the peak A at 400° C. was reduced by 20% from its peak intensity at room temperature.

The integrated intensities of the peaks (particularly those included in part B of FIG. 4) within the Raman shift range of less than 200 $cm^{-1}$ did not decrease by heating. It was confirmed that these peaks were not peaks attributed to absence of a center of symmetry of the oxynitride crystal.

What is claimed is:

1. A dielectric composition comprising a crystal of an oxynitride, wherein a peak attributed to absence of a center of symmetry of the crystal of the oxynitride is detected by Raman spectroscopy of the dielectric composition within a Raman shift range of 500 $cm^{-1}$ or less, and the oxynitride is $LaTiO_2N$.

2. A dielectric composition comprising a crystal of an oxynitride, wherein a peak is detected by Raman spectroscopy of the dielectric composition within a Raman shift range of 500 $cm^{-1}$ or less;

an integrated intensity of the peak decreases at 400° C. or more and 1000° C. or less, and the oxynitride is $LaTiO_2N$.

3. The dielectric composition according to claim 2, wherein the integrated intensity of the peak decreases at 500° C. or more and 700° C. or less.

4. A dielectric composition comprising a crystal of an oxynitride, wherein a peak is detected by Raman spectroscopy of the dielectric composition within a Raman shift range of 500 $cm^{-1}$ or less;

an analysis of an angle-resolved polarized micro-Raman spectrum of the dielectric composition demonstrates that an integrated intensity of the peak has rotation angle dependency and that the crystal of the oxynitride has a crystal structure with less symmetry than a cubic crystal structure, and the oxynitride is $LaTiO_2N$.

5. A capacitive element comprising the dielectric composition according to claim 1.

6. A visible-light photocatalytic material comprising the dielectric composition according to claim 1.

7. A visible-light photoelectric conversion element comprising the dielectric composition according to claim 1.

8. A capacitive element comprising the dielectric composition according to claim 2.

9. A visible-light photocatalytic material comprising the dielectric composition according to claim 2.

10. A visible-light photoelectric conversion element comprising the dielectric composition according to claim 2.

11. A capacitive element comprising the dielectric composition according to claim 4.

12. A visible-light photocatalytic material comprising the dielectric composition according to claim 4.

13. A visible-light photoelectric conversion element comprising the dielectric composition according to claim 4.

* * * * *